United States Patent [19]
Duve

[11] Patent Number: 5,557,207
[45] Date of Patent: Sep. 17, 1996

[54] STREET LIGHT TESTING KIT

[75] Inventor: George Duve, Washington, N.J.

[73] Assignee: Area Lighting Research, Inc., Hackettstown, N.J.

[21] Appl. No.: 376,864

[22] Filed: Jan. 23, 1995

[51] Int. Cl.$^6$ .................................................. G01R 31/24
[52] U.S. Cl. .......................... 324/414; 324/556; 324/133; 340/656
[58] Field of Search ..................... 315/135, 133, 315/129; 340/656, 654; 324/556, 133, 414

[56] References Cited

U.S. PATENT DOCUMENTS

| | | | |
|---|---|---|---|
| 4,496,905 | 1/1985 | Forte | 324/414 |
| 5,323,116 | 6/1994 | Atria | 324/414 |

FOREIGN PATENT DOCUMENTS

| | | | |
|---|---|---|---|
| 87-2143 | 4/1987 | WIPO | 324/414 |

Primary Examiner—Kenneth A. Wieder
Assistant Examiner—Jose M. Solis
Attorney, Agent, or Firm—Kirschstein et al.

[57] ABSTRACT

A testing kit for luminaire lamps includes a shorting cap that is to be substituted for a photoelectric sensing device to test its operability, and a luminaire lamp testing instrument that is to be used while the shorting cap is in place for testing the operation of the starter and the ballast associated with the luminaire. The shorting cap includes a plurality of equidistantly distributed indicating lights to enable the user to see one of them from any angle, a built-in circuit breaker that trips when there is a short circuit downstream from the photoelectric sensing device, and a pair of jacks for connecting a voltmeter thereto. The luminaire lamp testing instrument has an evaluation circuitry that determines whether or not the starter or the ballast function properly and causes either one of two lights, depending on the design wattage of the luminaire lamp, to issue visually distinguishable signals indicative of proper operation of the starter and the ballast, respectively.

18 Claims, 2 Drawing Sheets

STREET LIGHT TESTING KIT

BACKGROUND OF THE INVENTION

1. Field of the Invention

The present invention relates to electrical testing devices in general, and more particularly to a testing kit for testing the operation of various components of street lights and similar lighting fixtures employing electric arc discharge lamps as their light sources.

2. Description of the Related Art

There are already known various devices for testing electrical equipment, among them such which are especially suited or specifically designed for testing street lamps and similar high-intensity lighting devices, such as those employing electric discharge lamps, especially high pressure sodium lamps, as their sources of light. Light fixtures of this kind are known to those versed in the area lighting field as luminaires and will be referred to herein by that name.

Before discussing the state of the art, it is to be mentioned, without going into unnecessary detail, that in many street lighting systems each street lamp is equipped with its own photoelectric device that is strategically located so that its photoelectric sensor intercepts ambient light but not that issued by the luminaire of that street lamp, and its control circuitry is interposed in the wiring of the individual street lamp between the electric network that supplies electric power to a usually considerable number of street lamps distributed along a street, highway or similar route, and the electric circuit that is associated with the individual luminaire. Such electric circuit ordinarily incorporates, besides a socket that is provided with an internal, so-called mogul, thread into which an externally threaded portion of the light source or lamp proper is threaded, a starter and a ballast. The constructions and functions of the latter two devices are so well known that it would be an exercise in futility if it were attempted to describe them here in detail. Suffice it to say that the starter is operative for generating a high-voltage starting pulse that establishes the arc discharge within the lamp, while the ballast helps to sustain such discharge once established.

Whenever there is sufficient ambient light, the photoelectric sensing device shuts the luminaire off, that is, it disconnects the electric circuit of the particular street lamp from the electric power supply network. However, there may be a plethora of other or additional reasons why the lamp does not issue light when called for, of which failure of the lamp itself is just one. Yet, because the photoelectric device is supposed to prevent the affected street lamp from operating during daytime, the failure of a particular street lamp is not detected or reported until it gets dark outside. At that time, it is usually too late to send a repair crew over to fix the light. As a matter of fact, for safety and other reasons, street light repairs are typically conducted when it is light outside.

Of course, it may be either the photoelectric sensing device itself or the wiring leading to or from a socket that receives the photoelectric sensing device that is faulty. To test this, there has been developed a testing instrument having electrical contacts substantially corresponding to those of the photoelectric sensing device to enable interposition of the testing device instead of the photoelectric sensing device between the incoming wiring and that leading to the aforementioned electric circuit of the luminaire. The testing device includes a light-emitting diode that lights up when the presence of supply voltage is detected. By the same token, it indicates by not lighting up that the incoming wiring to, or the socket for, the photoelectric sensing device is defective. Moreover, the testing device, like the photoelectric device if fully operational, permits the supply voltage to pass therethrough to the luminaire. If the lamp of the latter strikes and begins to glow, a conclusion may reasonably be dram that it was the photoelectric sensing device that was at fault. However, to make sure, it is customary to reinstall the original photoelectric sensing device and use the so-called "glove test" (consisting of the technician placing his or her glove over the light-admitting orifice of the photoelectric sensing device to shield it from ambient light) to determine if the luminaire lamp lights up after the replacement of the photoelectric sensing device. If it does, then the problem was probably caused by insufficient or lacking electrical contact in the photoelectric sensing device socket and has likely been solved by the removal and reinstallation of the photoelectric sensing device. No further action is necessary. If it does not, then the next step is to replace the photoelectric sensing device by another one and use the glove test to see if the situation has been remedied by such substitution. If it has not, or if the luminaire lamp did not light up when the testing device was substituted for the photoelectric sensing device but the light-emitting diode of the testing device was on, then the fault is either with the luminaire lamp or its circuitry, or with the outgoing side of the photoelectric sensing device socket, of with the wiring connecting the socket with such circuitry.

Experience with this kind of testing device has shown that it is able to pinpoint or at least eliminate some of the reasons why the luminaire lamp does not light up. However, it was also established that it leaves much to be desired in certain respects. So, for instance, if the source of the problem is a short circuit in the wiring or circuitry downstream of the photoelectric device, then a substantial amount of electric current may flow through the testing device in a short period of time, thus damaging the same.

Moreover, even if the light of the testing device lights up during the testing, there is no assurance that the supply voltage detected is at a level sufficient for faultless operation of the luminaire lamp and its associated devices and circuitry, and there is no way to measure this voltage level while the testing by the testing device is in progress.

Last but not least, it is frequently difficult for the technician to determine whether or not the testing device light is lit, be it because, at the angle at which the technician is looking at the testing device, the light is obscured by other parts of the testing device or because, especially on bright sunny days, its light is difficult to discern over foreground or background reflections of the sunlight. Inasmuch as the angle of observation is given by the way the photoelectric device socket is mounted on the street lamp and the way the technician is situated, often already on a rather precarious perch, with respect to the street lamp, reliable "reading" of the testing device light cannot always be assured, especially when the extent to which the technician may move without imperiling himself or herself is limited.

Once it has been established in the manner described above that the problem lies elsewhere than with the photoelectric sensing device or the wiring leading to it, the inquiry is continued but at a slightly different location and using a different testing instrument. More particularly, while an electrical flow path is established through the photoelectric sensing device socket such as by installing the previously discussed testing device therein, the luminaire lamp is removed from its socket and a base of the testing instrument is threaded in its stead into such socket. One known testing instrument of this type is equipped with two lights and with circuitry that causes one of the lights to light up and blink when the presence of a starting pulse is detected, while causing the other light to light steadily when the ballast is operating properly and the voltage detected in the luminaire lamp socket is sufficient for the luminaire lamp to operate. Thus, if both lights are on, it must be the luminaire lamp that is defective; if the first light fails to operate, then the fault is with the starter, and it is with the ballast when the second light is not on. If neither one of the lights of the testing instrument lights up, then it is probably the wiring between the photoelectric sensing device and the luminaire lamp circuitry, or such circuitry itself, that is defective, since it is highly unlikely that both the starter and the ballast would give out at the very same time.

Here again, however, the known testing instrument has certain drawbacks that make its use less than completely satisfactory. For one, the instrument is incapable of indicating anything more with respect to the incoming voltage than whether or not it is above a predetermined level, even though it is often desirable to establish at least the range in which this incoming voltage can be found.

Moreover, the known testing instrument is dedicated to testing the electric circuits and wires for a single type of luminaire lamp only, even though there are at least two types operating on the same network voltage (105 V) differing from one another in wattage (below or above about 150 W, respectively) and arc voltage (50/55 V vs. 100/130 V). Inasmuch as the technician frequently does not know beforehand which type of luminaire lamp and associated electric circuit he or she will encounter when reaching the location of the luminaire, he or she must come equipped with two such instruments, one for each of the luminaire lamp types, and determine which one is the proper one only after reaching such lofty location. This not only is rather inconvenient and cumbersome, but may result in incorrect diagnosis or even lead to damage to the testing instrument used if the latter is of the wrong type.

Additionally, the provision of the base of the testing instrument with a mogul thread compatible with that of the luminaire lamp socket makes the instrument difficult to install and use not only in terms of the time that it takes to screw it in and out of the socket, but also, and possibly more importantly, in requiring the technician to manipulate the instrument extensively while at an inconvenient location and possibly holding the removed luminaire lamp at the same time.

SUMMARY OF THE INVENTION

Objects of the Invention

Accordingly, it is a general object of the present invention to avoid the disadvantages of the prior art.

More particularly, it is an object of the present invention to provide a testing kit for testing luminaire lamps and similar lighting devices, which includes testing instruments that do not possess the drawbacks of the known testing instruments of this type.

Still another object of the present invention is to devise a shorting cap of the type here under consideration which renders it possible to obtain reliable reading when viewing the cap from a convenient angle and minimizes the possibility of damage if used in conjunction with shorted luminaire wiring.

It is yet another object of the present invention to design a luminaire lamp socket testing instrument of the above kit in such a manner as to be able to use the same instrument for both of the aforementioned luminaire lamp types, to determine the range of operating voltage reaching the luminaire lamp socket, and to avoid the need for extensive maneuvering of the instrument while using the same.

A concomitant object of the present invention is so to construct the instruments of the kit of the above type as to be relatively simple in construction, inexpensive to manufacture, easy to use, and yet reliable in operation.

Features of the Invention

In keeping with the above objects and others which will become apparent hereafter, one feature of the present invention resides in a testing kit for luminaire lamps which includes a testing device constructed for substitution for a photoelectric sensor interposed between an electric supply network and an individual electric circuit associated with the luminaire lamp to be tested, and a testing instrument to be used instead of the luminaire lamp in conjunction with the testing device for testing the operation of the luminaire lamp itself, as well as of a starter and a ballast associated with the luminaire lamp.

According to the present invention, the testing device includes a housing having at least a portion through which a light emitted in the interior of the housing can be perceived from the exterior of the housing, an electric testing circuit accommodated in the housing and operative for issuing an electrical signal in response to detection of incoming voltage at a level above a predetermined level, and a plurality of light-issuing devices all connected to the testing circuit for substantially simultaneous activation thereof in response to the electrical signal, and distributed within the housing in such a pattern as to enable an observer to perceive the light of at least one of the light-issuing devices at any angle at which the observer can reasonably be expected to view the testing device.

Advantageously, the aforementioned portion of the housing is transparent. It is also advantageous when this portion of the housing has a substantially cup-shaped configuration and extends over the light-issuing devices. The light-issuing devices are advantageously equidistantly distributed about a central axis of symmetry of the housing. A particular advantage of the invention as described so far is that the technician using the testing device can perceive at least one of the lights being lit regardless of from what angle he or she is looking at the testing device as dictated by the circumstances.

According to another aspect of the present invention, the testing device has at least a line contact and a load contact, as well as electrically connecting means situated within the housing and operative for connecting the line and load contacts with one another to permit direct flow of electric current from the supply network to the individual electric circuit. According to the invention, the testing device further includes a circuit breaker accommodated in the housing and interposed in the electrically connecting means between the line and load contacts and operative for interrupting the flow of electric current therethrough when exceeding a predetermined tripping level. In this context, it is advantageous when the circuit breaker is equipped with a reset button accessible at the exterior of the housing for resetting the circuit breaker.

According to another facet of the present invention, the testing device further includes two jacks one electrically connected with the line contact and the other with a ground contact. The jacks are operative for receiving compatibly configured contacts of a voltmeter for measuring the voltage level between the line and ground contacts. The jacks are advantageously mounted on a top region of the cup-shaped portion of the housing and project outwardly from such top region.

It is also advantageous when the testing instrument includes a base having a central first contact, a cylindrical sleeve provided with a recess, and a spring-biased second contact received in the recess and projecting outwardly therefrom beyond the sleeve to contact an internal thread of a luminaire lamp socket when the testing instrument is in use. A special advantage of this approach is that the testing instrument can be easily introduced into and removed from the luminaire lamp socket when the luminaire lamp is absent therefrom, without having to laboriously thread it in and out.

The aforementioned luminaire lamp testing instrument advantageously includes an electric testing circuit operative for evaluating voltage levels attributable to the operation of a starter and a ballast of the particular luminaire being tested and issuing different electrical signals indicative of such operation independently for two types of luminaire lamps of different wattage levels. According to the invention, the testing instrument further includes a pair of lights each operated in response to the different electrical signals for one of the two luminaire lamp types to visually display if one or the other of the starter and ballast is defective.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawing.

DETAILED DESCRIPTION OF THE PREFERRED EMBODIMENT

Figure 1:
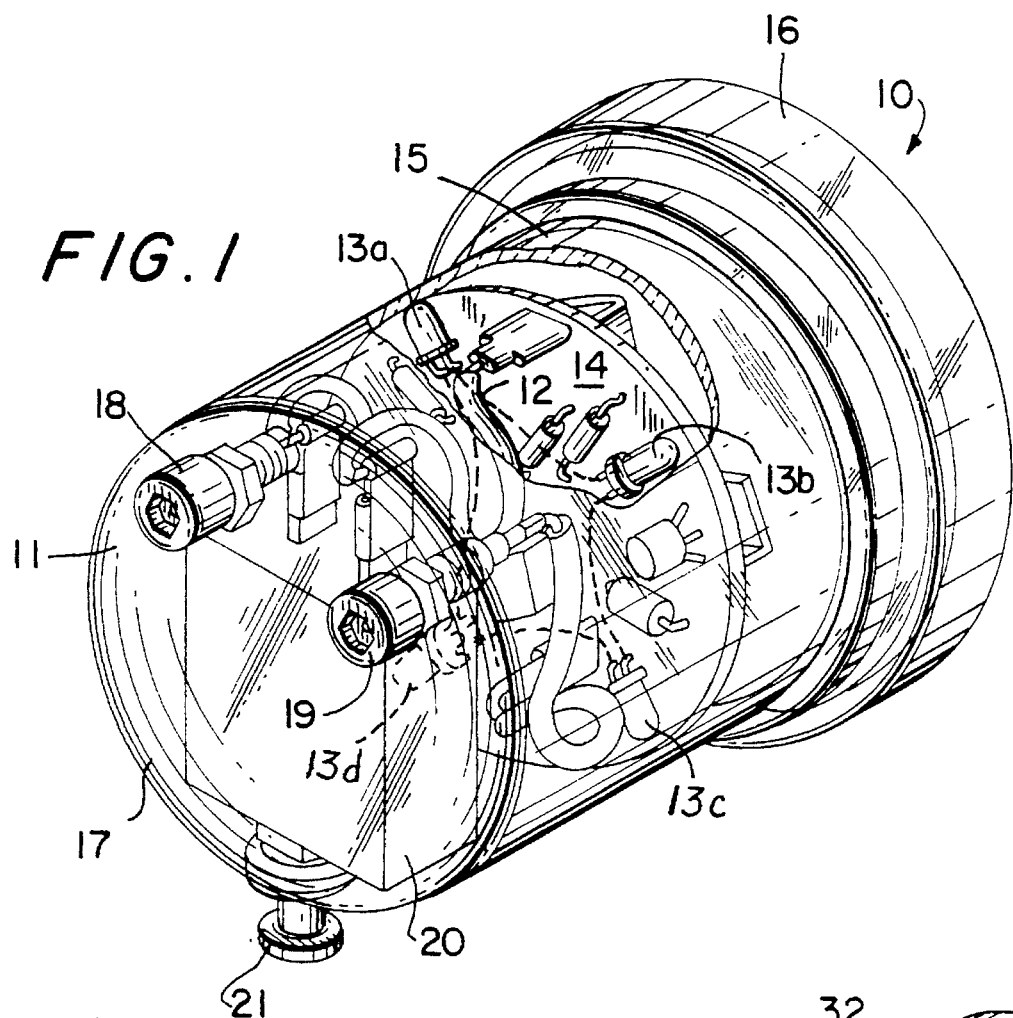
FIG. 1 is a somewhat simplified partially sectioned perspective view of a shorting cap component of a luminaire testing kit of the present invention.

Referring now to the drawing in detail, and first to FIG. 1 thereof, it may be seen that the reference numeral 10 has been used therein to identify a photoelectric sensing device testing component of a luminaire testing kit of the present invention in its entirety. As mentioned before, the testing component or device 10 is constructed and configured for use in testing electrical lighting devices, especially street lamps and similar luminaires, that utilize high-pressure sodium arc discharge lamps or the like for their light sources. Because of its configuration and function, the testing device 10 will be referred to herein as a shorting cap. This is so because the shorting cap 10 is to be used in searching, usually during daylight hours, for particular sources of problems causing a street light or similar lighting device not to function at night, by "shorting" or functionally bypassing the photoelectric sensing device that controls the operation of such lighting device, while the search for the source of the problem is in progress.

The shorting cap 10 includes a housing 11 that is equipped with electrical contacts or prongs (not shown in FIG. 1 of the drawing because they project from the side facing away from the observer) corresponding in configuration and distribution to those of the photoelectric sensing device for which the shorting cap 10 is to be temporarily substituted. The housing 11 accommodates electrical circuitry that is, by and large, conventional so that it need not be discussed here in any detail, except to say that it is operative for detecting if the voltage supplied to the photoelectric sensing device exceeds a predetermined level and indicating a positive answer to that inquiry by issuing an electrical signal.

In accordance with the present invention, this indicating electrical signal is supplied through an electrical conductor 12 to respective light-issuing devices 13a, 13b, 13c and 13d that are supported in any convenient manner on a support 14 such as a printed circuit board mounted in a fixed position within the housing 11. While the light-issuing devices or lights 13a, 13b, 13c and 13d have been illustrated, for the sake of convenience, as being constituted by miniature light bulbs, it should be appreciated that any other similar lighting equipment, such as light-emitting diodes, may be used instead or even preferentially. As shown, the light-issuing devices 13a, 13b, 13c and 13d are connected in series, so that all of them will light up at the same time upon issuance of the aforementioned indicating signal, so long as all of them are functional. Now, it should be understood that at least a substantially bell-shaped portion 15 of the housing 11 that covers the aforementioned circuitry and light-issuing devices 13a, 13b, 13c and 13d (but not necessarily its base 16 that carries the aforementioned electrical contacts or prongs) is of a transparent (or at least translucent) material for the user of the testing device or shorting cap 10 to be able to discern the lighting (or absence thereof) of at least one of the light-issuing devices 13a, 13b, 13c and 13d from any convenient angle from which the user may be looking at the shorting cap 10. The number of the light-issuing devices 13a, 13b, 13c and 13d (usually four will suffice) and their distribution on the support 14 (typically at substantially 90° apart) are chosen with this objective in mind, to take into account the fact that the technician using the shorting cap 10 is often not able to freely choose the angle from which to view the latter during the testing operation.

The housing 11 also carries, on its front wall 17, a pair of jacks or electrical receptacles 18 and 19. Electrical wires contained in the housing 11 connect the jacks 18 and 19, in a manner that is well known and hence has not been illustrated in order not to unduly encumber the drawing, with the "line" and "ground" prongs or contacts of the shorting cap 10, respectively. The jacks 18 and 19 serve for receiving compatibly configured contact-establishing elements of a voltmeter when it is desired to measure the voltage that is available at the photoelectric sensing device socket. If the thus measured voltage is lower by more than a predetermined margin than that which should be available, then it would behoove the technician to inspect the wiring leading from the electric current supply network to the photoelectric device socket for possible damage.

FIG. 1 of the drawing also shows that the shorting cap 10 is further provided with a circuit breaker 20 mounted at a fixed location within the housing 11. The circuit breaker 20 is of a commercially available variety so that its construction need not be discussed here, nor does the way it is electrically connected need to be shown in the drawing; rather, it is sufficient to mention that the circuit breaker 20 is electrically interposed between the "load" and "line" prongs or contacts of the shorting cap 10. Because of this arrangement, the circuit breaker 20 will trip (i.e. interrupt the flow of electric current therethrough between the aforementioned prongs) if the amount of such current flow prior to tripping is excessive, which is an indication of the presence of a short circuit in or downstream of (toward the luminaire from) the photoelectric sensing device socket. This circuit breaking action avoids overheating of and/or other damage to the testing device 10 or its environment. The circuit breaker 20 is shown to be further provided with a reset button 21 that permits the technician to restore the testing device 10 to its fully operational state after the danger has passed.

Figure 2:
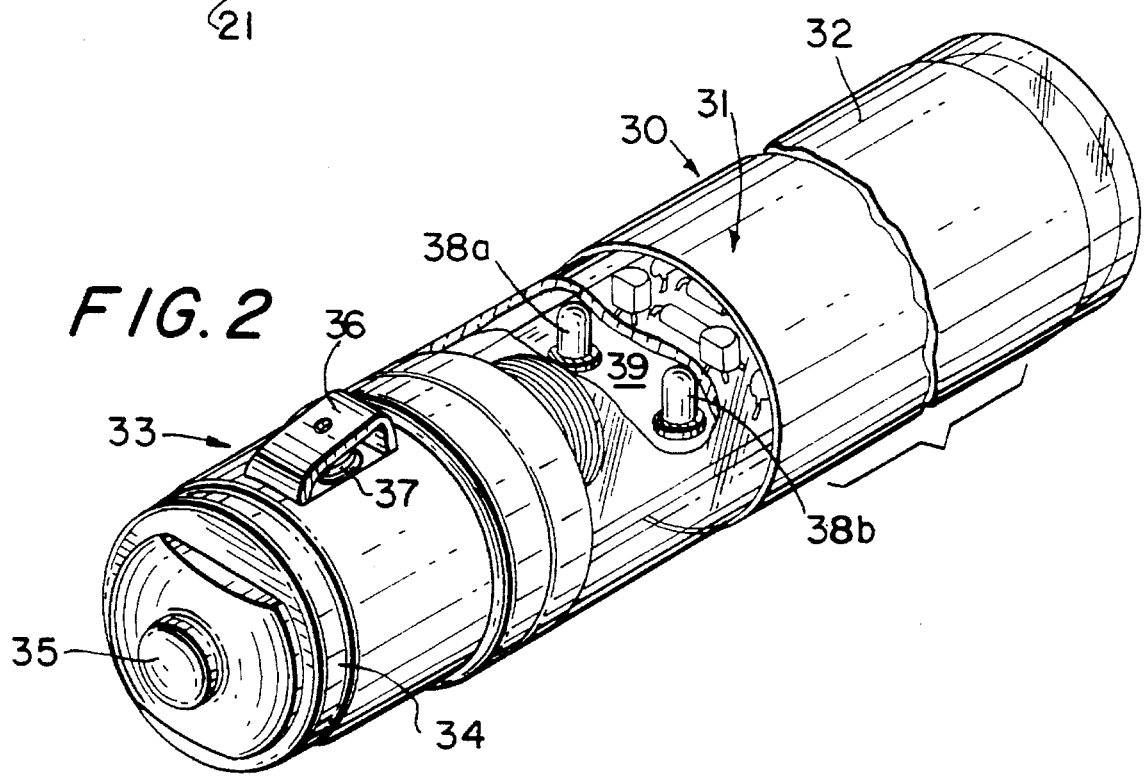
FIG. 2 is another perspective view akin to the previous one but showing a lamp testing component of the luminaire testing kit.

Turning now to FIG. 2 of the drawing, it may be seen that it depicts a testing instrument 30 that forms a part of the same testing kit as the shorting cap 10 described above but is designed for testing a different part of the electrical circuitry and/or wiring of the luminaire lamp than the shorting cap 10. The testing instrument or tester 30 includes a casing 31 that, generally speaking, consists of a main portion 31 and a base 33. It may be seen that the base 33 includes a shell 34 which, rather than being provided with an external mogul thread as is customary in testing instruments of this type, is cylindrical. To establish the required electrical connections with the luminaire lamp socket during this phase of the street light testing when the tester 30 is substituted for the possibly but not necessarily faulty luminaire lamp, the tester base 33 is provided, at its free end, with a generally bead-shaped first contact 35 that is to cooperate with a centrally located first contact of the luminaire lamp socket. The second contact is constituted, at least in part, by a nose-shaped projection 36 which, as shown in a greatly exaggerated manner in FIG. 2, projects outwardly (i.e. substantially radially) out of the base 35 beyond the outer circumferential surface of the shell 34. The nose 36 and usually even the shell 34 is of an electrically conductive material to establish electrical contact with the internal mogul thread of the luminaire lamp socket. Of course, if the shell 34 is of an electrically conductive material, it has to be electrically insulated, in a manner well known in the art, from the first contact 35.

It may be sufficient for the nose-shaped projection 36 to be constituted by a bent-out resilient portion of the base shell 34. However, as illustrated, the projection 36 is advantageously constituted by an element separate from the shell 34 and mounted in a recess or opening provided in the base shell 34 for pivoting between its illustrated extended position and a retracted position in which it is substantially flush with (i.e. extends only to a small extent past) the base shell 34. A spring 37 is shown to urge the projection or element 36 towards its extended position.

The use of the smooth cylindrical shell 34 with a diameter that is somewhat smaller than the clear (i.e. smallest) diameter of the luminaire lamp socket, coupled with the provision of the resiliently yieldable projection 36, renders it possible to introduce the base 33 into the luminaire lamp socket by a simple axial insertion of the base 33 into the socket and yet to reliably establish the requisite electrical contacts through the first contact 35 and the second contact or projection 36 of the base 33 and/or the base shell 34 if the latter is electrically conductive. If the clearance between the shell 34 and the mogul thread of the luminaire lamp socket is within certain limits that depend on the exact configuration of the projection or element 36, the presence of the latter does not even interfere with the axial extraction of the base 33 from the luminaire socket after completion of this phase of the testing.

As mentioned before, the tester 30 of the present invention is designed for testing the circuitry for both lower-wattage (50–150 W), lower-voltage (50–55 V), and higher-wattage (150–400 W), higher-voltage (100–130 V) luminaire lamps, wherein the voltages referred to are the those required to sustain the arc discharge in the high pressure sodium tube or the like, as opposed to the alternating voltage supplied to the luminaire lamp circuit, for which the value of less than 170 and more than 175 $V_{rms}$ is used by the tester 30 to differentiate between the lower-voltage and higher-voltage luminaires, respectively. To be able to determine for which type of luminaire lamp the starter and the ballast of the respective street lamp is suited, the testing device 30 is equipped with two lights 38a and 38b, both mounted on a printed circuit board or similar support 39 at a predetermined spacing from one another. Here again, while the lights 38a and 38b have been shown as miniature light bulbs, it is currently preferred to actually use light-emitting diodes for such lights 38a and 38b.

Figure 3:
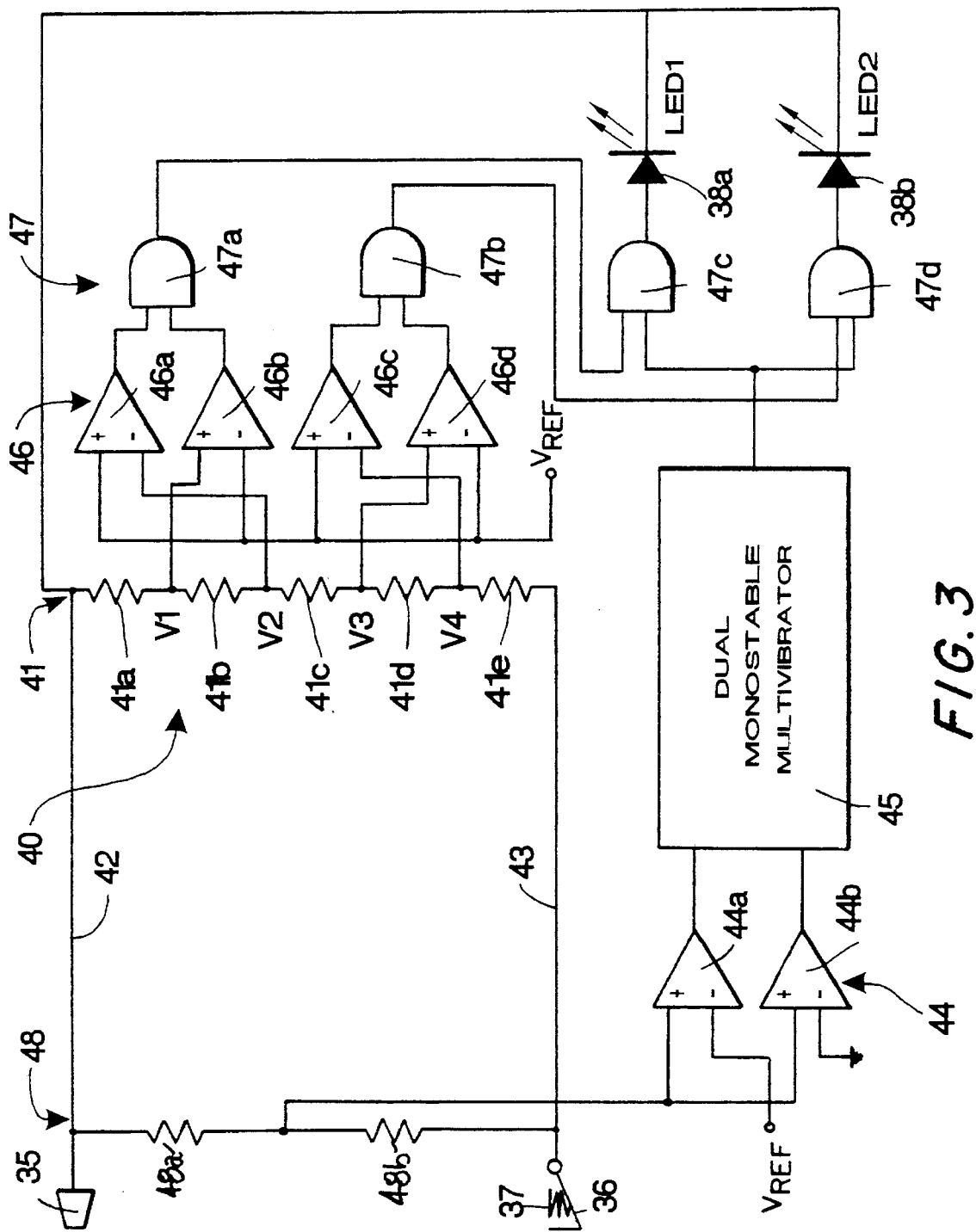
FIG. 3 is somewhat simplified circuit diagram of the electrical testing circuitry of the lamp testing component of FIG. 2.

One of the lights 38a and 38b, such as 38a, is indicative of the existence (or, conversely, lack of) a signal indicative of conditions suited (or not suited) for the operation of the lower-wattage luminaire lamps, while the other light 38b does the same for the higher-voltage luminaire lamps. These signals are generated in an evaluation circuitry 40 that is shown in FIG. 3 of the drawing in some detail but also in a somewhat simplified manner in order not to unnecessarily clutter the drawing. As a comparison of FIG. 3 with FIG. 2 will reveal, the evaluation circuitry 40 is interposed between the electric contacts 35 and 36 of the tester 30 and the light-issuing devices 38a and 38b (also identified as LED1 and LED2, respectively). The evaluation circuitry includes, as its main components, a voltage divider including resistors 41a to 41e that are arranged in series between electric conductors 42 and 43 that are connected to the contacts 36 and 37, respectively, a pair 44 of voltage level detectors 44a and 44b, a dual monostable multivibrator 45, an array 46 of comparators 46a to 46d, and an array 47 of AND-gates 47a to 47d. All of these components and the elements constituting the same are well known to those skilled in the art and are commercially available from a variety of sources and hence need not and will not be discussed here.

In use, the voltage level detectors or comparators 44a and 44b compare a voltage representative of the starter pulse with a predetermined reference voltage $V_{REF}$ and with ground voltage, respectively, thus determining whether or not the starter pulse voltage is within acceptable bounds. The aforementioned representative voltage is shown to be derived from a tap between two resistors 48a and 48b of an auxiliary voltage divider 48 that is also interposed between the electric conductors 42 and 43. The resistance values of the resistors 48a and 48b may differ from one another and are chosen in such a manner that the voltage level of the representative voltage is well within the optimum operation range of the voltage level comparators 44a and 44b when a starter pulse of acceptable voltage is applied to the circuitry 40. The output signals of the voltage level detectors 44a and 44b are supplied to the dual monostable multivibrator 45 that utilizes them in a well known manner to issue an oscillating signal with a predetermined frequency in response thereto. This oscillating signal which, as will be appreciated, is issued only when the starter is operating properly, is supplied to one input of each of the AND-gates 47c and 47d and continues for the entire duration of the testing operation once the starter voltage of acceptable value has been detected.

Simultaneously with the operation of the above-discussed part of the circuit 40, the voltage divider 41 presents, at tap points or junctures between the individual resistors 41a to 41e, respective voltages identified in FIG. 3 of the drawing as V1 to V4. The comparators 46a to 46d of the array 46 compare the voltages V2, V1, V4 and V3, in that order, with a reference voltage $V_{REF}$ that may be the same as or different from that mentioned before, and issue output signals if their levels exceed the same. The output signals of the comparators 46a and 46b, on the one hand, and of comparators 46c and 46d, on the other hand, are supplied to the inputs of the AND-gates 47a and 47b of the array 47, respectively. Consequently, an indicating signal (high voltage level indicative of binary "1", for instance,) will appear at the output of the gate 47a only if the voltage supplied to the circuit 40 on a continuous basis (from the ballast) is between V1 and V2. Correspondingly, a similar indicating signal will be presented at the output of the AND-gate 47b only if the sustained voltage is between V3 and V4. Of course, the values of the resistors 41a to 41e of the voltage divider 41 are so chosen relative to one another that the voltage levels V1 to V4 correspond to the acceptable limits for the voltages issued by a properly functioning ballast for the lower-wattage and the higher-wattage luminaire lamps. Thus, the appearance of the aforementioned indicating signals at the outputs of the AND-gates 47a or 47b is indicative of proper functioning of the respective ballast.

The output signals of the AND-gates 47a and 47b are supplied to respective other inputs of associated AND-gates 47c and 47d, respectively, where they are combined with the oscillating signals derived from the output of the multivibrator 45. This means that, when both the ballast and the starter function properly, the respective AND-gate 47c or 47d (depending on the type of luminaire lamp) will issue an oscillating signal. If the starter is not operating properly or at all but the ballast operates within acceptable range, then the respective AND-gate 47c or 47d issues an output signal, but that signal will not oscillate because the operation of the multivibrator 45 has not been triggered by the (absent) starter pulse. On the other hand, if the ballast operates defectively or not at all, then the respective AND-gate 47c or 47d will not issue any signal at all even if the multivibrator is in operation, having been triggered by a proper starter pulse. The output signals of the AND-gates 47c and 47d are supplied to the aforementioned light-issuing devices or lights 38a and 38b that convert them into light signals that a technician may perceive or "read". Of course, at least that portion of the tester casing 41 that overlies the lights 38a and 38b is transparent or at least translucent to enable such visual perception.

It may be seen that, besides indicating, by oscillating or steady light or absence thereof which of the luminaire lamp, ballast or starter is the culprit causing the luminaire lamp not to light up (provided that the wiring extending between the photoelectric sensor device socket and the luminaire lamp socket is intact), making it the candidate of choice for replacement, the testing instrument 30 also appraises the technician of the compatibility of such components. So, for instance, the ballast may be operating properly and yet its output voltage may not be that designed for the particular type of luminaire lamp. In that case, the "wrong" light 38b or 38a will light up, making the technician aware of this situation and letting him or her decide, possibly after testing the voltage level more accurately using a voltmeter, whether the deviation is within acceptable bounds or if the ballast needs to be replaced.

It will be understood that each of the elements described above, or two or more together, may also find a useful application in other types of constructions differing from the type described above.

While the present invention has been described and illustrated herein as embodied in specific constructions of testing instruments of a kit for testing street lights and their luminaires, it is not limited to the details of this particular construction, since various modifications and structural changes may be made without departing from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is desired to be protected by Letters Patent is set forth in the appended claims.

What is claimed is:

1. A testing kit for luminaire lamps, comprising:
   a) a testing device constructed for substitution for a photoelectric sensor interposed between an electric supply network and an individual electric circuit associated with the luminaire lamp to be tested, said testing device including
      a housing having at least a portion through which a light emitted in the interior of said housing can be perceived from the exterior of said housing,
      an electric testing circuit accommodated in said housing and operative for issuing an electrical signal in response to detection of incoming voltage at a level above a predetermined level, and
      a plurality of light-issuing devices all connected to said testing circuit for substantially simultaneous activation thereof in response to said electrical signal, and distributed within said housing in such a pattern as to enable an observer to perceive the light of at least one of said light-issuing devices at any angle at which the observer can reasonably be expected to view the testing device; and
   b) a testing instrument to be used instead of the luminaire lamp in conjunction with said testing device for testing the operation of the luminaire lamp itself, as well as of a starter and a ballast associated with the luminaire lamp.

2. The testing kit as defined in claim 1, wherein said portion of said housing is transparent.

3. The testing kit as defined in claim 1, wherein said portion of said housing has a substantially cup-shaped configuration and extends over said light-issuing devices.

4. The testing kit as defined in claim 3, wherein said portion of said housing has a central axis of symmetry; and wherein said light-issuing devices are equidistantly distributed about said central axis.

5. The testing kit as defined in claim 1, wherein said testing device has at least a line contact and a load contact, as well as electrically connecting means situated within said housing and operative for connecting said line and load contacts with one another to permit direct flow of electric current from the supply network to said individual electric circuit, and further comprising a circuit breaker accommodated in said housing and interposed in said electrically connecting means between said line and load contacts and operative for interrupting the flow of electric current therethrough when exceeding a predetermined tripping level.

6. The testing kit as defined in claim 5, wherein said circuit breaker has a reset button accessible at the exterior of said housing for resetting said circuit breaker.

7. The testing kit as defined in claim 5, wherein said testing device further has a ground contact; and further comprising two jacks one electrically connected with said line contact and the other with said ground contact and operative for receiving compatibly configured contacts of a voltmeter for measuring the voltage level between said line and ground contacts.

8. The testing kit as defined in claim 7, wherein said portion of said housing has a substantially cup-shaped configuration and includes a top region; and wherein said jacks are mounted on and project outwardly from said top region.

9. The testing kit as defined in claim 1, wherein said testing instrument is elongated along an axis, and is insertable along said axis, and is insertable along said axis into a luminaire lamp socket when the testing instrument is in use.

10. The testing kit as defined in claim 9, wherein said testing instrument includes a base having a central first contact, a cylindrical sleeve provided with a recess, and a spring-biased second contact received in said recess and projecting outwardly therefrom beyond said sleeve to contact an internal thread of said luminaire lamp socket when the testing instrument is in use.

11. The testing kit as defined in claim 1, wherein said testing instrument includes two contacts for establishing electrical contact with corresponding contacts of a luminaire lamp socket, and an electric evaluation circuit operative for evaluating voltage levels attributable to the operation of a starter and a ballast of the particular luminaire being tested and issuing different electrical signals indicative of such operation independently for two types of luminaire lamps of different wattage levels.

12. The testing kit as defined in claim 11, and further comprising a pair of lights each operated in response to said different electrical signals for one of said two luminaire lamp types to visually display if one or the other of the starter and ballast is defective.

13. A testing device for substitution for a photoelectric sensor interposed between an electric supply network and an individual electric circuit associated with a luminaire lamp to be tested, said testing device comprising:

a) a housing having at least a portion through which a light emitted in the interior of said housing can be perceived from the exterior of said housing;

b) an electric testing circuit accommodated in said housing and operative for issuing an electrical signal in response to detection of incoming voltage at a level above a predetermined level; and c) a plurality of light-issuing devices all connected to said testing circuit for substantially simultaneous activation thereof in response to said electrical signal, and distributed within said housing in such a pattern as to enable an observer to perceive the light of at least one of said light-issuing devices at any angle at which the observer can reasonably be expected to view the testing device.

14. The testing device as defined in claim 13, and further comprising at least a line contact and a load contact, as well as electrically connecting means situated within said housing and operative for connecting said line and load contacts with one another to permit direct flow of electric current from the supply network to said individual electric circuit; and a circuit breaker accommodated in said housing and interposed in said electrically connecting means between said line and load contacts and operative for interrupting the flow of electric current therethrough when exceeding a predetermined tripping level.

15. The testing device as defined in claim 14, and further comprising a ground contact; and two jacks one electrically connected with said line contact and the other with said ground contact and operative for receiving compatibly configured contacts of a voltmeter for measuring the voltage level between said line and ground contacts.

16. A testing instrument for substitution for a luminaire lamp to test the operation of the luminaire lamp itself, as well as of a starter and a ballast associated with the luminaire lamp, said testing instrument comprising:

a) a casing elongated along an axis and insertable along said axis into a socket of the luminaire lamp to be tested;

b) two contacts for establishing electrical contact with corresponding contacts of the luminaire lamp socket; and c) an electric evaluation circuit operative for evaluating voltage levels attributable to the operation of a starter and a ballast of the particular luminaire being tested and issuing different electrical signals indicative of such operation independently for two types of luminaire lamps of different wattage levels.

17. The testing instrument as defined in claim 16, and further comprising a pair of lights each operated in response to said different electrical signals for one of said two luminaire lamp types to visually display if one or the other of the starter and ballast is defective.

18. The testing instrument as defined in claim 16, wherein said casing includes a base having a central first contact, a cylindrical sleeve provided with a recess, and a spring-biased second contact received in said recess and projecting outwardly therefrom beyond said sleeve to contact an internal thread of said luminaire lamp socket when the testing instrument is in use.

* * * * *